(12) United States Patent
Chang

(10) Patent No.: US 8,214,983 B2
(45) Date of Patent: Jul. 10, 2012

(54) PROCESS FOR PRODUCING PIEZOELECTRIC CERAMIC DEVICES

(75) Inventor: Chen-Ming Chang, Taipei (TW)

(73) Assignee: Tatung Company, Taipei (TW)

(*) Notice: Subject to any disclaimer, the term of this patent is extended or adjusted under 35 U.S.C. 154(b) by 508 days.

(21) Appl. No.: 12/457,860

(22) Filed: Jun. 24, 2009

(65) Prior Publication Data

US 2010/0077581 A1   Apr. 1, 2010

(30) Foreign Application Priority Data

Oct. 1, 2008   (TW) .............................. 97137807 A

(51) Int. Cl.
*H04R 17/10* (2006.01)
*B29C 45/37* (2006.01)

(52) U.S. Cl. ......... 29/25.35; 29/848; 264/620; 264/241; 264/272.16; 310/340; 310/348

(58) Field of Classification Search ................ 29/25.35, 29/848, 856, 593; 264/618, 620, 241, 272.16; 310/340, 344, 348
See application file for complete search history.

(56) References Cited

U.S. PATENT DOCUMENTS 1,969,379 A * 8/1934 Meissner ................. 29/25.35 X
5,016,333 A * 5/1991 Payne et al. .......... 264/272.16 X

FOREIGN PATENT DOCUMENTS

JP           62177986 A   *   8/1987
* cited by examiner

*Primary Examiner* — A. Dexter Tugbang
(74) *Attorney, Agent, or Firm* — Bacon & Thomas, PLLC

(57) ABSTRACT

An improved process for producing a piezoelectric ceramic device is disclosed, wherein the process includes the following steps: securing a metal plate in a mold cavity body by maintaining a binding area on a top surface of the metal plate, and that the top surface other than the binding area is enveloped, confined and secured; coating a metal paste on the binding area; placing a piezoelectric ceramic powder on the metal paste; pressing a pressing pillar on the piezoelectric ceramic powder; securing the pressing pillar in position; heating the mold cavity body so as to sinter the piezoelectric ceramic powder as a sintered body, and heating the mold cavity body so as to treat the sintered body to become a not-yet polarized piezoelectric ceramic sheet. Therefore, the same mold is employed for the piezoelectric ceramic powder sintering, the heat treatment, and the positioning and binding to the metal plate.

7 Claims, 4 Drawing Sheets

PROCESS FOR PRODUCING PIEZOELECTRIC CERAMIC DEVICES

BACKGROUND OF THE INVENTION

1. Field of the Invention

The present invention relates to a process for producing piezoelectric ceramics, and more particularly, to an improved process for producing a piezoelectric ceramic device.

2. Description of Related Art

Piezoelectric ceramics are widely applied to shakers, wave filters, actuators, transformers, buzzers, and so forth.

Referring to FIG. 1, a conventional process flowchart for producing a piezoelectric ceramic device, in order to sinter a piezoelectric ceramic powder to form a sintered body, a first mold is required in this stage.

Then heat treatment is proceeded for the sintered body where the piezoelectric ceramic sintered body is heated in the first mold; and after the piezoelectric ceramic sintered body has been formed, grinding work thereto is necessary in order to achieve a required thickness such that various specifications may be met.

During steps of the process, the sintered body, which has been under heat treatment, is polarized so as to form a piezoelectric ceramic sheet. Then, the piezoelectric ceramic sheet is bound and secured to a metal plate, where a second mold is required to position the piezoelectric ceramic sheet and the metal plate, and then an ordinary adhesive is employed for the securing.

In a final step, a positive and a negative poles are formed on the piezoelectric ceramic sheet and the metal plate, respectively, such is essential for electric power supply, and thereafter, a piezoelectric ceramic device is finished.

Given the above, it is understood that in the conventional manufacturing process, different molds are required for the sintering step and the positioning and binding step, respectively.

SUMMARY OF THE INVENTION

According to the present invention, an improved process for producing a piezoelectric ceramic device comprises the following steps:

(A) maintaining a binding area on a top surface of a metal plate, and that the top surface other than the binding area is enveloped, confined and secured in a mold cavity body;

(B) coating a metal paste on the binding area;

(C) placing a piezoelectric ceramic powder on the metal paste;

(D) pressing a pressing pillar on the piezoelectric ceramic powder;

(E) adjusting a location of the pressing pillar such that the piezoelectric ceramic powder takes a predetermined thickness;

(F) securing the pressing pillar in position;

(G) heating the mold cavity body so as to sinter the piezoelectric ceramic powder as a sintered body, wherein the metal paste, under a sintering temperature, fails to be chemically combined with the metal plate and the piezoelectric ceramic powder; and (H) heating the mold cavity body so as to treat the sintered body to become a not-yet polarized piezoelectric ceramic sheet.

Thereafter, a further step can be proceeded to take out the not-yet polarized piezoelectric ceramic sheet from the mold cavity body, then polarization and poles-formation are proceeded thereto.

Through the improved steps of the process, as mentioned above, according to the present invention, only one single mold is employed to achieve the purpose of piezoelectric ceramic powder sintering, heat treatment, and positioning and binding with the metal plate. Therefore, unlike the conventional art, a positioning and binding mold can be eliminated, and that the steps of the whole process in producing the piezoelectric ceramic device can be simplified so as to enhance efficiency of production.

In step (E), as mentioned above, at least one pad is employed to lift up the pressing pillar, such that the thickness of the sintered body of piezoelectric ceramic powder can be adjusted precisely. Further, in step (A), as mentioned above, bottom and peripheral of the metal plate may touch a loading surface and an inner wall of the mold cavity body, respectively; and a bushing is taken for pressing on an area of a top surface of the metal plate, other than the binding area, so as to refrain the metal plate from deformation under high temperature.

The pressing pillar may be provided, peripherally and radially extending, with a flange, where the flange of the pressing pillar is secured in position on the bushing, as described in step (F).

Preferably, the metal paste may be of an adhesive having low activity, such as silver paste, solder, or gold paste. The mold, preferably, may be made of graphite, of cobalt-bound hard alloy, of steel-bound hard alloy, or of metal ceramics.

Other objects, advantages, and novel features of the present invention will become more apparent from the following detailed description when taken in conjunction with the accompanying drawings.

DETAILED DESCRIPTION OF THE PREFERRED EMBODIMENTS

Figure 3:
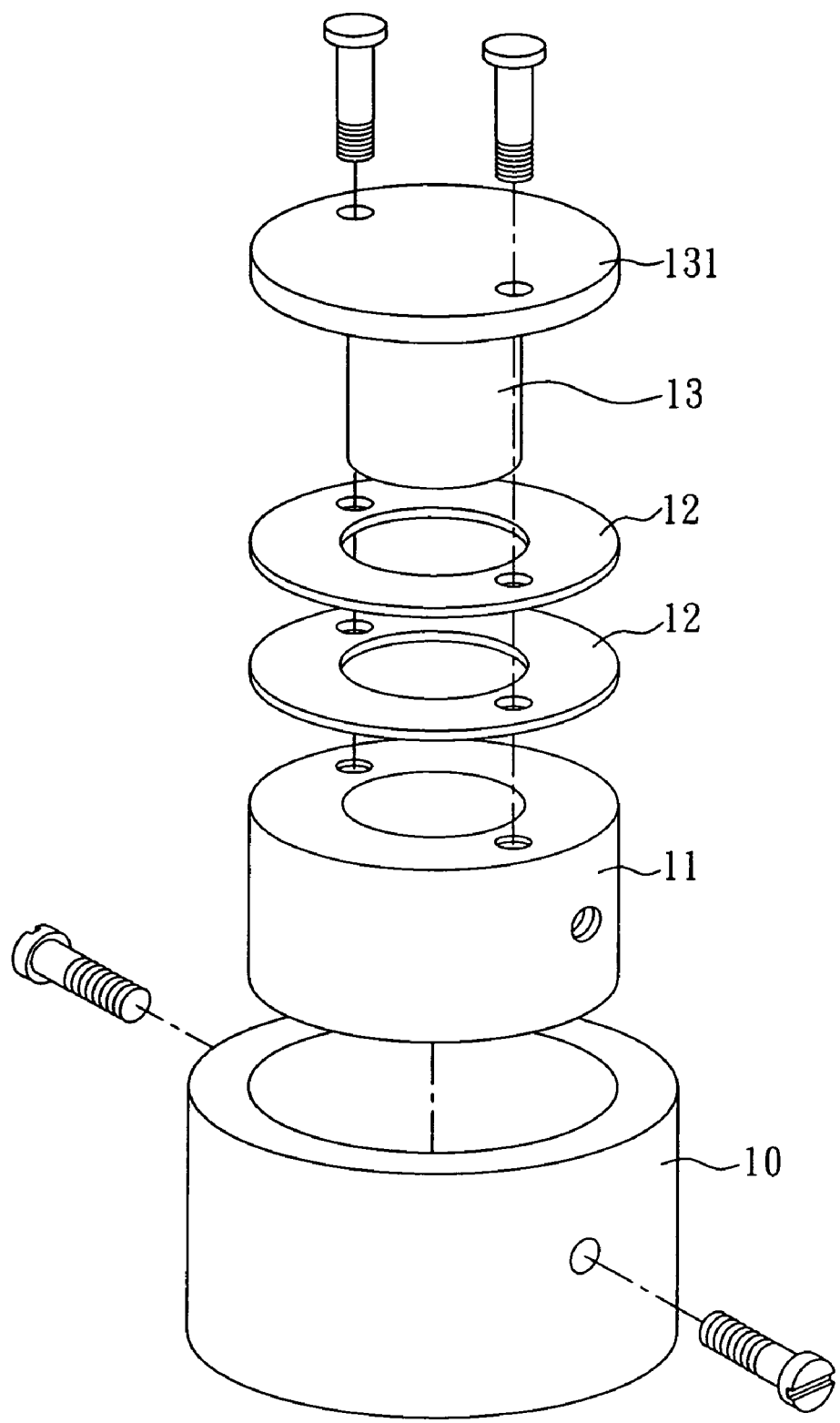
FIG. 3 is an exploded view illustrating a mold for sintering a piezoelectric ceramic powder according to the present invention.

Referring to FIG. 3, an exploded view illustrating a mold for sintering a piezoelectric ceramic powder according to the present invention, the mold comprises a cylindrical mold cavity body 10, a cylindrical hollow bushing 11, a plurality of pads 12, and a pressing pillar 13 having a flange 131.

Figure 1:
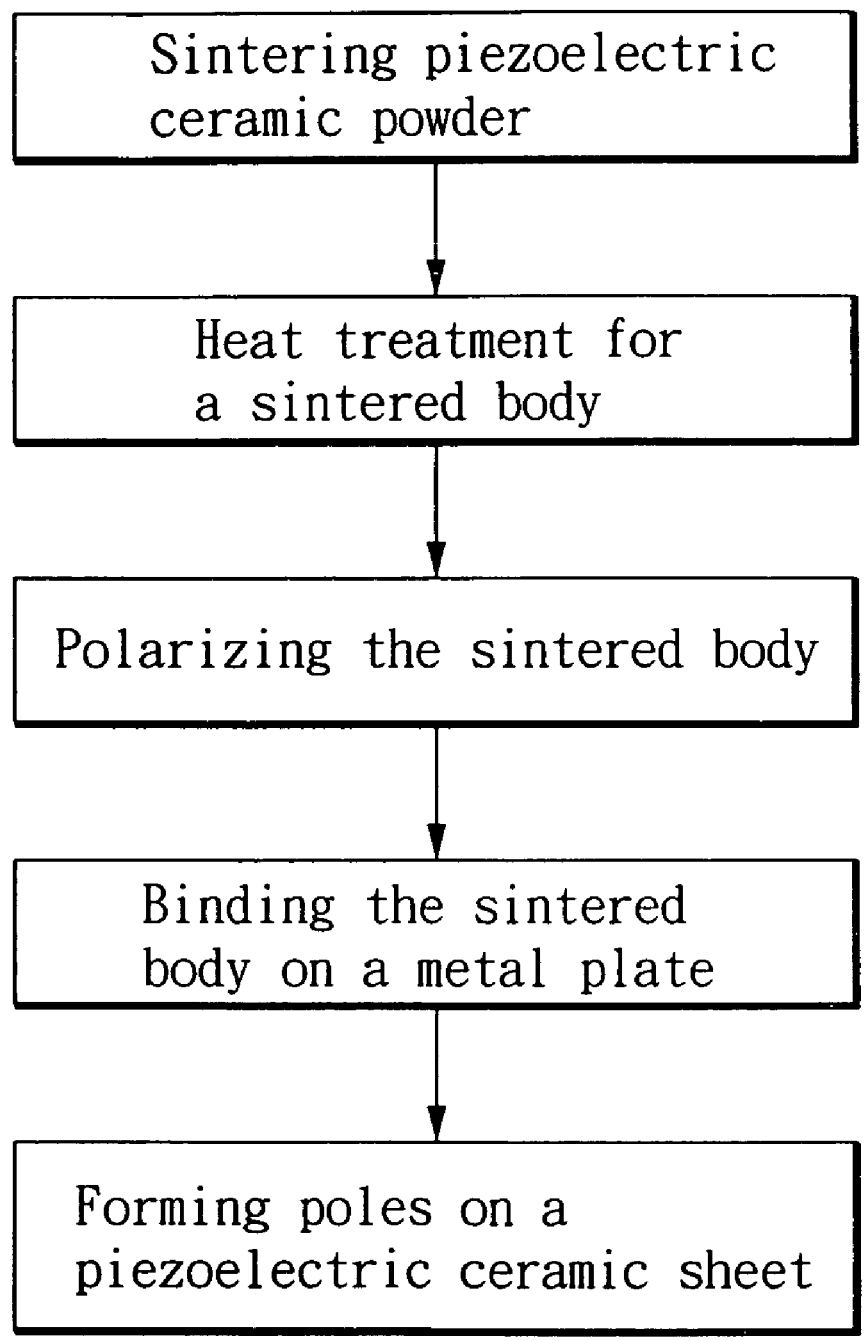
FIG. 1 is a conventional process flowchart for producing a piezoelectric ceramic device.
Figure 2:
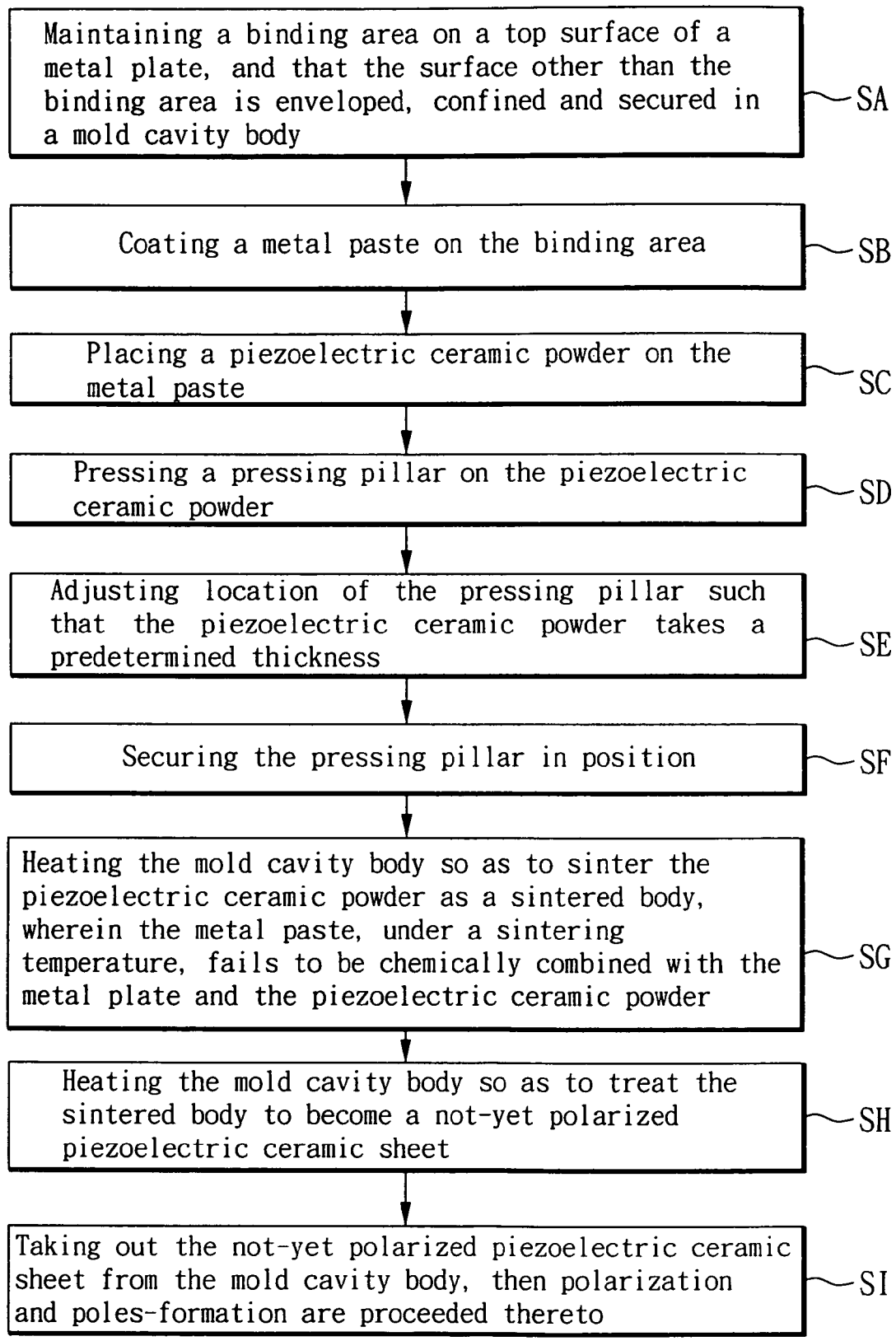
FIG. 2 is a process flowchart for producing a piezoelectric ceramic device according to the present invention.
Figure 4A:
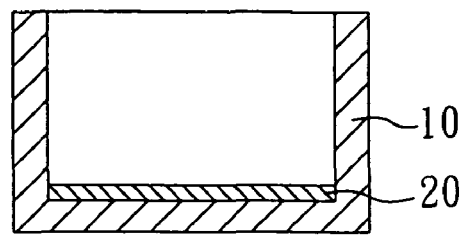
FIGS. 4A to 4E are schematic views illustrating the piezoelectric ceramic powder sintering in the mold.

Further referring to FIG. 2, a process flowchart for producing a piezoelectric ceramic device according to the present invention, and to FIGS. 4A to 4E, schematic views illustrating the piezoelectric ceramic powder sintering in the mold, first, in step SA, the metal plate of a piezoelectric ceramic device, normally a copper plate 20, is placed in the mold cavity body 10, where bottom of the copper plate 20 touches a loading surface of the mold cavity body 10, and peripheral of the copper plate 20 fits an inner wall of the mold cavity body 10. That is to say, an internal diameter of the mold cavity body 10 is equal to a diameter of the copper plate 20, as shown in FIG. 4A.

Figure 4B:
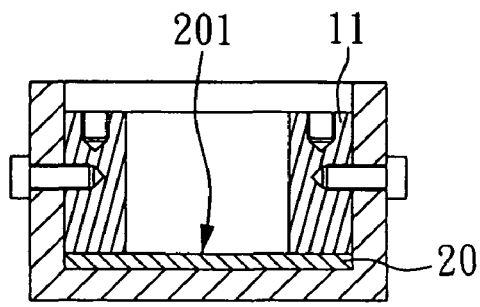

Further, the bushing 11 is taken for pressing on the copper plate 20, such that a hollow portion of the bushing 11 exposes part of a top surface of the copper plate 20, where the exposed top surface area is called "a binding area 201" and the bushing 11 can be positioned firmly by a threadedly engaging measure, as shown in FIG. 4B. Under the circumstances, except for maintaining the binding area 201 at top surface, the copper plate 20 is substantially enveloped and confined in the mold cavity body 10. The significance to confine and secure the copper plate 20 is to refrain it from deformation under high temperature.

Figure 4C:
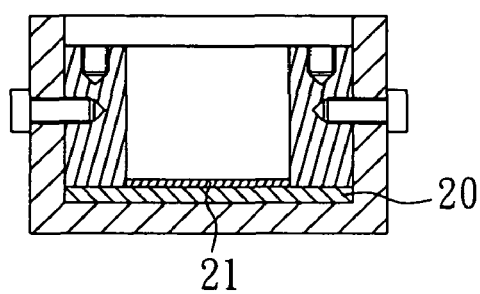

Subsequently, in step SB, a metal paste 21 is applied to coat on the binding area 201, as shown in FIG. 4C. It should be noted that the metal paste 21, under normal sintering temperatures for the piezoelectric ceramic powder, must not be chemically combined with the copper plate 20 and a piezoelectric ceramic powder 22, such as a gold paste, a silver paste or a solder.

Figure 4D:
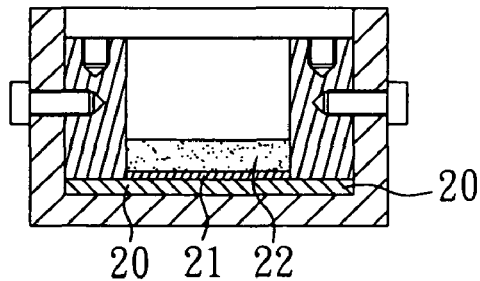
Figure 4E:
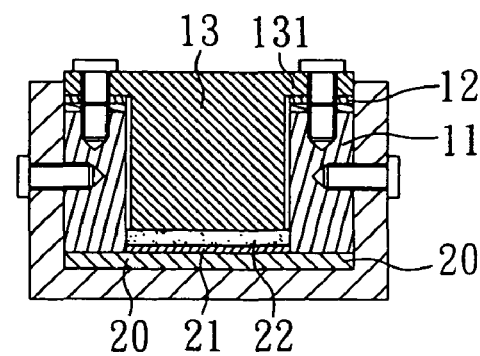

In step SC, the piezoelectric ceramic powder 22 is applied on the metal paste 21, as shown in FIG. 4D. Then, in step SD, the pressing pillar 13 presses on the piezoelectric ceramic powder 22, where location for the pressing pillar 13 to press down on the piezoelectric ceramic powder 22 is adjusted appropriately. The location of the pressing pillar 13 determines the thickness of the sintered body of piezoelectric ceramic powder. Namely, when the flange 131 of the pressing pillar 13 abuts on the bushing 11, a pressing surface of the pressing pillar 13 happens to abut on the copper plate 20, therefore, if the pads 12 are incorporated therewith, the thickness of the sintered body of piezoelectric ceramic powder can be adjusted and precisely formed. In other words, to arrange the pads 12 and to lift up the pressing pillar 13, and the height of the lift will be approximately equal to the thickness of the sintered body of piezoelectric ceramic powder, as shown in FIG. 4E.

Thereafter, in step SF, elongated bolts are provided for extending through the flange 131 and the pads 12, and into the bushing 11 so as to secure the pressing pillar 13 in position.

Further, in step SG, the mold cavity body 10 is heated so as to sinter the piezoelectric ceramic powder. After the piezoelectric ceramic powder has been sintered, the sintered body can be formed. During step SH, a heat treatment is proceeded to the mold cavity body 10 in raising or lowering temperature, such that a product formed at this stage relates to a not-yet polarized piezoelectric ceramic sheet. Then, finally, in step SI, the not-yet polarized piezoelectric ceramic sheet is taken out from the mold cavity body 10, and polarization and poles-formation are proceeded thereto, so that a complete piezoelectric ceramic device can be formed.

In the present invention, the mold, the bushing 11, and the pressing pillar 13 are made of graphite so that a merit of easy parting can be obtained. Alternatively, other materials such as cobalt-bound hard alloy, steel-bound hard alloy, or metal ceramics, etc., can be used.

In view of the above, according to the present invention, only one single mold is employed to achieve the purpose of piezoelectric ceramic powder sintering, heat treatment, and binding with the copper plate. Since copper is highly active, and gets chemical combination easily with piezoelectric ceramic materials under high temperature, in the present invention, metal paste, which has a low tendency in chemical combination with copper and piezoelectric ceramic materials, is employed so as to separate the same from each other. As such, the metal paste not only is used to bind together the piezoelectric ceramics and the copper, but also to achieve the purpose of separation and refraining from chemical combination. Use of silver paste has a merit of low cost. Unlike the conventional art, in the present invention, the sintered body of piezoelectric ceramic powder is not required to position and bind with the metal plate. This is because during the whole stage of mold design, related dimension and specification have been taken into consideration beforehand.

Although the present invention has been explained in relation to its preferred embodiments, it is to be understood that many other possible modifications and variations can be made without departing from the scope of the invention as hereinafter claimed.

What is claimed is:

1. An improved process for producing a piezoelectric ceramic device comprises the following steps:
   (A) maintaining a binding area on a top surface of a metal plate, and that the top surface other than the binding area is enveloped, confined and secured in a mold cavity body;
   (B) coating a metal paste on the binding area;
   (C) placing a piezoelectric ceramic powder on the metal paste;
   (D) pressing a pressing pillar on the piezoelectric ceramic powder;
   (E) adjusting location of the pressing pillar such that the piezoelectric ceramic powder takes a predetermined thickness;
   (F) securing the pressing pillar in position;
   (G) heating the mold cavity body so as to sinter the piezoelectric ceramic powder as a sintered body, wherein the metal paste, under a sintering temperature, fails to be chemically combined with the metal plate and the piezoelectric ceramic powder; and
   (H) heating the mold cavity body so as to treat the sintered body to become a not-yet polarized piezoelectric ceramic sheet.

2. The process as claimed in claim 1, wherein in step (E), at least one pad is employed to lift up the pressing pillar.

3. The process as claimed in claim 1, wherein in step (A), bottom and peripheral portions of the metal plate touch a loading surface and an inner wall of the mold cavity body, respectively; and wherein a bushing is taken for pressing on an area of the top surface of the metal plate, other than the binding area.

4. The process as claimed in claim 3, wherein the pressing pillar is provided, peripherally and radially extending, with a flange, and in step (F), the flange of the pressing pillar is secured in position on the bushing.

5. The process as claimed in claim 1, wherein the mold, is made from one of: graphite, cobalt-bound hard alloy, steel-bound hard alloy, or metal ceramics.

6. The process as claimed in claim 1, wherein the metal paste is one of silver paste, solder, or gold paste.

7. The process as claimed in claim 1, further comprising step (I): taking out the not-yet polarized piezoelectric ceramic sheet from the mold cavity body, then performing steps of polarization and poles-formation on the piezoelectric ceramic sheet.

* * * * *